(12) United States Patent
Cheng

(10) Patent No.: US 12,396,200 B2
(45) Date of Patent: Aug. 19, 2025

(54) ENHANCEMENT-TYPE SEMICONDUCTOR STRUCTURE AND MANUFACTURING METHOD THEREOF

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 462 days.

(21) Appl. No.: 17/970,959

(22) Filed: Oct. 21, 2022

(65) Prior Publication Data

US 2023/0133164 A1 May 4, 2023

(30) Foreign Application Priority Data

Oct. 29, 2021 (CN) .......................... 202111275591.X

(51) Int. Cl.
| | | |
|---|---|---|
| *H01L 29/778* | (2006.01) |
| *H10D 30/01* | (2025.01) |
| *H10D 30/47* | (2025.01) |
| *H10D 62/824* | (2025.01) |
| *H10D 62/85* | (2025.01) |

(52) U.S. Cl.
CPC ......... *H10D 30/475* (2025.01); *H10D 30/015* (2025.01); *H10D 62/824* (2025.01); *H10D 62/8503* (2025.01)

(58) Field of Classification Search
None
See application file for complete search history.

(56) References Cited

U.S. PATENT DOCUMENTS

2017/0345922 A1* 11/2017 Iucolano .............. H10D 30/015

* cited by examiner

*Primary Examiner* — William C Trapanese
(74) *Attorney, Agent, or Firm* — The Small Patent Law Group LLC; Christopher R. Carroll

(57) ABSTRACT

The present disclosure provides an enhancement-type semiconductor structure and a manufacturing method thereof. The enhancement-type semiconductor structure includes: a semiconductor substrate and a heterojunction structure distributed from bottom to top; where the heterojunction structure includes a channel layer close to the semiconductor substrate and a first potential barrier layer far away from the semiconductor substrate; the heterojunction structure includes a gate region, and a source region and a drain region on two sides of the gate region respectively, and an intermediate layer is sandwiched between the channel layer and the first potential barrier layer in the gate region, the intermediate layer is adapted to depolarize the contacted first potential barrier layer.

17 Claims, 4 Drawing Sheets

ENHANCEMENT-TYPE SEMICONDUCTOR STRUCTURE AND MANUFACTURING METHOD THEREOF

CROSS REFERENCE TO RELATED APPLICATIONS

This application claims priority to Chinese Patent Application No. 202111275591.X filed on Oct. 29, 2021, the entire content of which is incorporated herein by reference.

TECHNICAL FIELD

This present disclosure relates to the field of semiconductor, and more particular, to an enhancement-type semiconductor structure and a manufacturing method thereof.

BACKGROUND

Gallium nitride (GaN) is the representative of the third-generation wide band gap semiconductor, and is receiving extensive attentions. Superior properties of GaN mainly include: high electron mobility and high two-dimensional electron gas (2 DEG) concentration. In addition, GaN materials have stable chemical properties, high temperature resistance, and corrosion resistance, and have inherent advantages in applications such as high-frequency, high-power, and radiation-resistant.

High electron mobility transistors (HEMTs) based on AlGaN/GaN heterojunctions have been widely used in the semiconductor field. This type of device has the characteristics of high reverse blocking voltage, low forward conduction resistance, and high operating frequency, so the requirements of the system for semiconductor devices with higher power, higher frequency, and smaller size can be met.

HEMT devices generally have a p-type semiconductor layer to deplete the two-dimensional electron gas under the gate electrode to achieve normally-off of the devices. However, the activation efficiency of traditional p-type ions, such as Mg ions as dopants, are only about 2% after activation, so a high doping concentration of Mg ions ($>1e19$ cm$^{-3}$) is required to achieve p-type semiconductor layer. In addition, Mg doping has a self-compensation effect, and if the doping concentration of Mg ions continues to increase, the hole concentration of the p-type semiconductor layer will decrease instead.

In order to solve the above problems, the thickness of the p-type semiconductor layer can be increased to provide more hole concentration to deplete the two-dimensional electron gas under the gate electrode to realize normally-off of the device. However, if the thickness of the p-type semiconductor layer is too large, the control ability of the gate electrode to the channel will be reduced, and the device performance will be deteriorated.

SUMMARY

The present disclosure provides an enhancement-type semiconductor structure and a manufacturing method thereof, which can realize the normally off of the device and the strong control ability of the gate electrode to the channel.

An aspect of the present disclosure provides an enhancement-type semiconductor structure to achieve the above purposes, including:

a semiconductor substrate; and a heterojunction structure on the semiconductor substrate, where the heterojunction structure comprises a channel layer close to the semiconductor substrate and a first potential barrier layer far away from the semiconductor substrate; the heterojunction structure includes a gate region, and a source region and a drain region located on two sides of the gate region respectively, the heterojunction structure further comprises an intermediate layer sandwiched between the channel layer in the gate region and the first potential barrier layer in the gate region, and the intermediate layer is to depolarize the contacted first potential barrier layer.

In some embodiments, the intermediate layer is an amorphous layer, and a material of the amorphous layer includes at least one of silicon nitride, silicon dioxide, silicon oxynitride, and hafnium oxide, aluminum oxide or aluminum oxynitride.

In some embodiments, the intermediate layer is a polycrystalline layer, and a material of the polycrystalline layer includes at least one of polycrystalline diamond, polycrystalline nickel oxide, or polycrystalline gallium nitride.

In some embodiments, a material of the channel layer includes a gallium nitride-based material, and one of: a material of the first potential barrier layer includes aluminum nitride or a gallium nitride-based material containing aluminum; and the first potential barrier layer is a multi-layer structure formed by one or more gallium nitride-based material layers containing aluminum and one or more aluminum nitride layers.

In some embodiments, a thickness of the intermediate layer is more than 0.2 nm.

In some embodiments, a thickness ratio of the first potential barrier layer to the intermediate layer is less than 50:1.

In some embodiments, the heterojunction structure further includes: a second potential barrier layer sandwiched between the channel layer and the first potential barrier layer, where a material of the channel layer includes a gallium nitride-based material, a material of the second potential barrier layer includes a gallium nitride-based material containing aluminum or the second potential barrier layer is a multi-layer structure formed by one or more gallium nitride-based material layers containing aluminum and one or more aluminum nitride layers; the intermediate layer is sandwiched between the first potential barrier layer in the gate region and the second potential barrier layer in the gate region; and at least one of a thickness of the second potential barrier layer is less than 10 nm or a Al content of the gallium nitride-based material containing aluminum of the second potential barrier layer is less than 10%.

In some embodiments, the heterojunction structure further includes: a second potential barrier layer sandwiched between the channel layer and the first potential barrier layer, where a material of the channel layer includes a gallium nitride-based material, a material of the second potential barrier layer includes aluminum nitride, a thickness of the second potential barrier layer is less than 10 nm; the intermediate layer is sandwiched between the first potential barrier layer in the gate region and the second potential barrier layer in the gate region.

In some embodiments, the enhancement-type semiconductor structure further includes: a gate structure located in the gate region, and a source electrode and a drain electrode located on two sides of the gate structure respectively.

In some embodiments, the enhancement-type semiconductor structure further includes: a passivation layer which is disposed between the gate structure and the source electrode and between the gate structure and the drain electrode.

In some embodiments, the gate structure is a stacked structure of a gate insulating layer and a gate electrode, or only includes the gate electrode.

In some embodiments, the source electrode and the drain electrode contact the channel layer or the first potential barrier layer.

Another aspect of the present disclosure provides a method of manufacturing enhancement-type semiconductor structure, including:

providing a semiconductor substrate on which a channel layer is formed;

forming an intermediate layer on a part of the channel layer; forming a first potential barrier layer on the intermediate layer and on the channel layer uncovered by the intermediate layer; where the channel layer, the intermediate layer and the first potential barrier layer form a heterojunction structure, and the heterojunction structure comprises a gate region, and a source region and a drain region on two sides of the gate region respectively, the intermediate layer is sandwiched between the channel layer in the gate region and the first potential barrier layer in the gate region, and the intermediate layer is to depolarize the contacted first potential barrier layer.

In some embodiments, the intermediate layer is an amorphous layer, and a material of the amorphous layer includes at least one of silicon nitride, silicon dioxide, silicon oxynitride, and hafnium oxide, aluminum oxide or aluminum oxynitride, and the amorphous layer is formed by physical vapor deposition, chemical vapor deposition, or atomic layer deposition.

In some embodiments, the intermediate layer is a polycrystalline layer, and a material of the polycrystalline layer comprises at least one of polycrystalline diamond, polycrystalline nickel oxide, or polycrystalline gallium nitride.

In some embodiments, a thickness of the intermediate layer is more than 0.2 nm.

In some embodiments, a thickness ratio of the first potential barrier layer to the intermediate layer is less than 50:1.

In some embodiments, the method further comprises: before forming the intermediate layer, forming a second potential barrier layer on the channel layer, where a material of the channel layer includes a gallium nitride-based material, a material of the second potential barrier layer includes a gallium nitride-based material containing aluminum or the second potential barrier layer is a multi-layer structure formed by one or more gallium nitride-based material layers containing aluminum and one or more aluminum nitride layers, and at least one of a thickness of the second potential barrier layer is less than 10 nm or a Al content of the gallium nitride-based material containing aluminum in the second potential barrier layer is less than 10%;

forming the intermediate layer on a part of the second potential barrier layer; forming the first potential barrier layer on the intermediate layer and on the second potential barrier layer uncovered by the intermediate layer; where the channel layer, the second potential barrier layer, the intermediate layer and the first potential barrier layer form the heterojunction structure, the intermediate layer is sandwiched between the first potential barrier layer in the gate region and the second potential barrier layer in the gate region.

In some embodiments, the method further comprises: before forming the intermediate layer, forming a second potential barrier layer on the channel layer, where a material of the channel layer includes a gallium nitride-based material, a material of the second potential barrier layer includes aluminum nitride, and a thickness of the second potential barrier layer is less than 10 nm;

forming the intermediate layer on a part of the second potential barrier layer, forming the first potential barrier layer on the intermediate layer and on the second potential barrier layer uncovered by the intermediate layer; where the channel layer, the second potential barrier layer, the intermediate layer and the first potential barrier layer form the heterojunction structure, the intermediate layer is sandwiched between the first potential barrier layer in the gate region and the second potential barrier layer in the gate region.

In some embodiments, the method further comprises: forming a gate structure in the gate region, and forming a source electrode and a drain electrode on two sides of gate structure respectively.

In some embodiments, the gate structure is a stacked structure of a gate insulating layer and a gate electrode, or only comprises the gate electrode.

In some embodiments, the source electrode and the drain electrode both contact the channel layer or the first potential barrier layer.

Compared with the prior art, the present disclosure has the following beneficial effects:

in the heterojunction structure, an intermediate layer is sandwiched between the channel layer in the gate region and the first potential barrier layer in the gate region, when the turn-on voltage is not applied to the gate electrode, the intermediate layer may cause the first potential barrier layer on the intermediate layer cannot generate polarization effect, and the gate region cannot generate two-dimensional electron gas, so that the device can be normally off; when a turn-on voltage is applied to the gate electrode, the first potential barrier layer in the gate region can generate a polarization effect, so the gate region can generate two-dimensional electron gas, so that the conduction of the device can be realized. In addition, when the intermediate layer is needed to make the first potential barrier layer on the intermediate layer be depolarized, the intermediate layer is required to be relatively thin. In this way, the gate electrode has a strong ability to control the channel.

Figure 1:
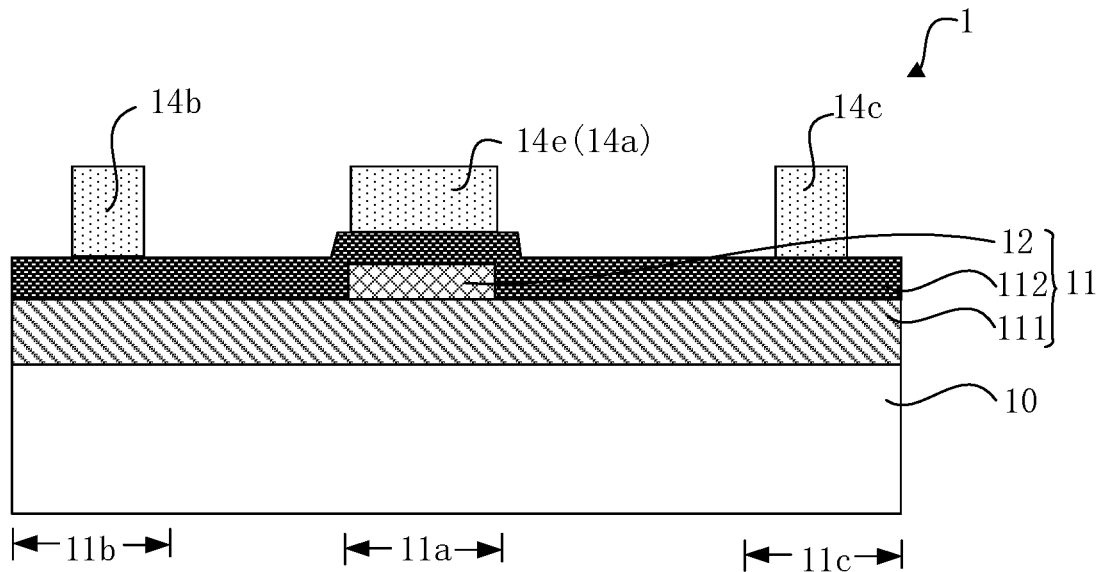
FIG. 1 is a schematic diagram of the sectional structure of the enhancement-type semiconductor structure according to a first embodiment of the present disclosure.

To facilitate the understanding of the present disclosure, all reference signs present in the present disclosure are listed below:

| | |
|---|---|
| semiconductor substrate 10 | heterojunction structure 11 |
| channel layer 111 | first potential barrier layer 112 |
| gate region 11a | source region 11b |
| drain region 11c | intermediate layer 12 |
| passivation layer 13 | second potential barrier layer 113 |
| gate structure 14a | source electrode 14b |
| drain electrode 14c | gate insulation layer 14d |
| gate electrode 14e | |
| enhancement-type semiconductor structure 1, 2, 3, 4, 5, 6 | |

DETAILED DESCRIPTION OF THE EMBODIMENTS

In order to make the above-mentioned objects, features and advantages of the present disclosure more obvious and understandable, embodiments of the present disclosure will be described in detail below with reference to the accompanying drawings.

FIG. 1 is a schematic diagram of the sectional structure of the enhancement-type semiconductor structure according to the first embodiment of the present disclosure.

Referring to FIG. 1, the enhancement-type semiconductor structure 1 includes:

a semiconductor substrate 10 and a heterojunction structure 11 distributed from bottom to top, the heterojunction structure 11 includes a channel layer 111 close to the semiconductor substrate 10 and a first potential barrier layer 112 far away from the semiconductor substrate 10; the heterojunction structure 11 includes a gate region 11a, and a source region 11b and a drain region 11c located on two sides of the gate region 11a respectively, an intermediate layer 12 is sandwiched between the channel layer 111 in the gate region 11a and the first potential barrier layer 112 in the gate region 11a, and the intermediate layer 12 is adapted to depolarize the contacted first potential barrier layer 112;

a gate structure 14a located in the gate region 11a, and the source electrode 14b and drain electrode 14c located on two sides of the gate structure 14a respectively.

The material of the semiconductor substrate 10 may include sapphire, silicon carbide, silicon or diamond.

Referring to FIG. 1, the heterojunction structure 11 includes a channel layer 111 close to the semiconductor substrate 10 and a first potential barrier layer 112 far away from the semiconductor substrate 10. Two-dimensional electron gas can be formed at the interface between the channel layer 111 and the first potential barrier layer 112.

The materials of channel layer 111 and the first potential barrier layer 112 can both include III-V Group compound materials, and the band gap of the first potential barrier layer 112 is greater than that of channel layer 111. The material of the first potential barrier layer 112 may include aluminum nitride or a gallium nitride-based material containing aluminum, or the first potential barrier layer 112 is a multilayer structure formed by one or more gallium nitride-based material layers containing aluminum and one or more aluminum nitride layers, and the material of the channel layer 111 may include a gallium nitride-based material, such as GaN. The containing-aluminum gallium nitride-based material include, for example, AlGaN or AlInGaN.

In the multilayer structure formed by the gallium nitride-based material layer containing aluminum and the aluminum nitride layer, for example, but not limited to, the thickness of the AlGaN layer is 0.8 nm, and the thickness of the aluminum nitride layer is 0.2 nm.

In an example, the intermediate layer 12 can be an amorphous layer, and the material of the amorphous layer can include at least one of silicon nitride, silicon dioxide, silicon oxynitride, hafnium oxide, aluminum oxide, or aluminum oxynitride.

In another example, the intermediate layer 12 can be a polycrystalline layer, and the polycrystalline layer material can include at least one of polycrystalline diamond, polycrystalline nickel oxide, or polycrystalline gallium nitride.

The thickness of the intermediate layer 12 may be greater than 0.2 nm. When the thickness of the intermediate layer 12 is less than 0.2 nm, that is, the intermediate layer 12 is too thin to make the first potential barrier layer 112 on the intermediate layer 12 become amorphous or polycrystalline. In an example, the thickness of the intermediate layer 12 may be greater than 1 nm. In another example, the thickness of the intermediate layer 12 may be greater than 5 nm.

In this embodiment, the gate structure 14a only includes the gate electrode 14e. The materials of gate electrode 14e, source electrode 14b and drain electrode 14c can include metals, such as Ti/Al/Ni/Au, Ni/Au, etc. Schottky contact can be formed between the gate electrode 14e and the heterojunction structure 11, ohmic contact can be formed between the source electrode 14b and source region 11b, and between drain electrode 14c and drain region 11c.

In this embodiment, when the turn-on voltage is not applied to the gate electrode 14e, the first potential barrier layer 112 on the intermediate layer 12, whether the intermediate layer 12 is in an amorphous or polycrystalline state, can be depolarized, that is, polarization effect cannot be generated, and two-dimensional electron gas cannot be generated in the gate region 11a, thus the enhancement-type semiconductor structure 1 can be normally off.

When the turn-on voltage is applied to the gate electrode 14e, the first potential barrier layer 112 in the gate region 11a can produce a polarization effect, so that the gate region 11a can produce two-dimensional electron gas, thus enabling the enhancement-type semiconductor structure 1 is conductive.

The thickness ratio of the first potential barrier layer 112 to the intermediate layer 12 may be less than 50:1 to ensure that when the turn-on voltage is not applied to the gate electrode 14e, the intermediate layer 12 can cause the first potential barrier layer 112 on the intermediate layer 12 to be depolarized, thereby preventing the first potential barrier layer 112 from producing a polarization effect when first potential barrier layer 112 is too thick.

In the enhancement-type semiconductor structure 1, if the intermediate layer 12 is needed to make the first potential barrier layer on the intermediate layer 12 be depolarized, the intermediate layer 12 is required to be relatively thin. In this way, the gate electrode 14e has a strong ability to control the channel.

Figure 2:
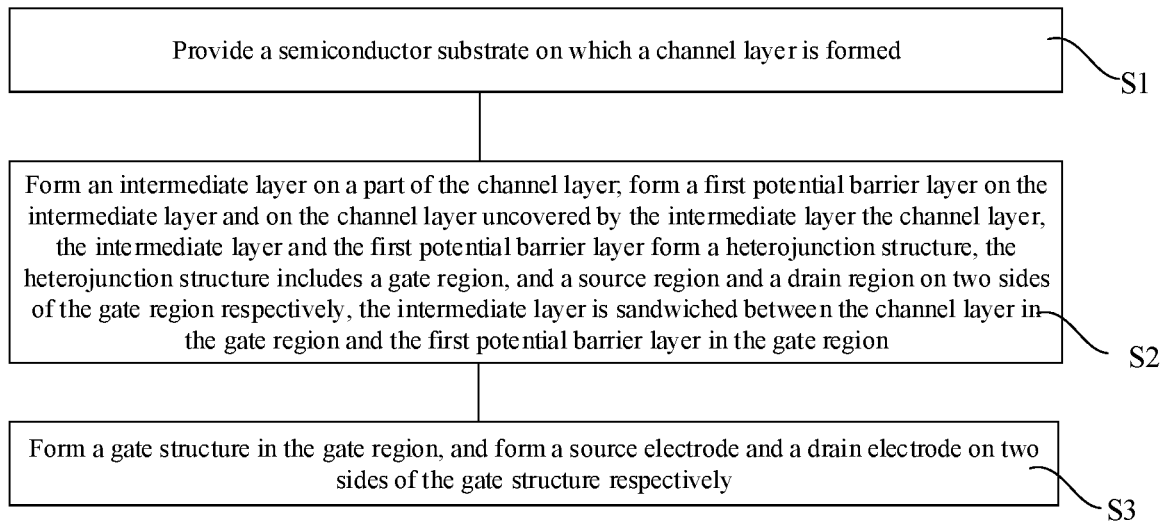
FIG. 2 is a flowchart of the manufacturing method of the enhancement-type semiconductor structure in FIG. 1.
Figure 3:
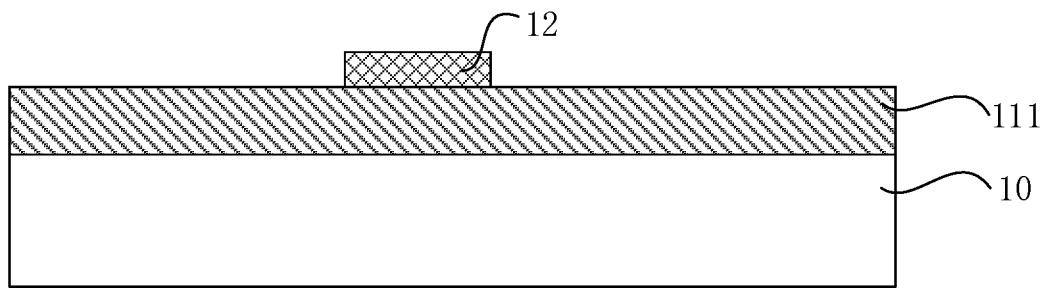
FIGS. 3 and 4 are schematic views illustrating intermediate structures corresponding to the process of FIG. 2.
Figure 4:
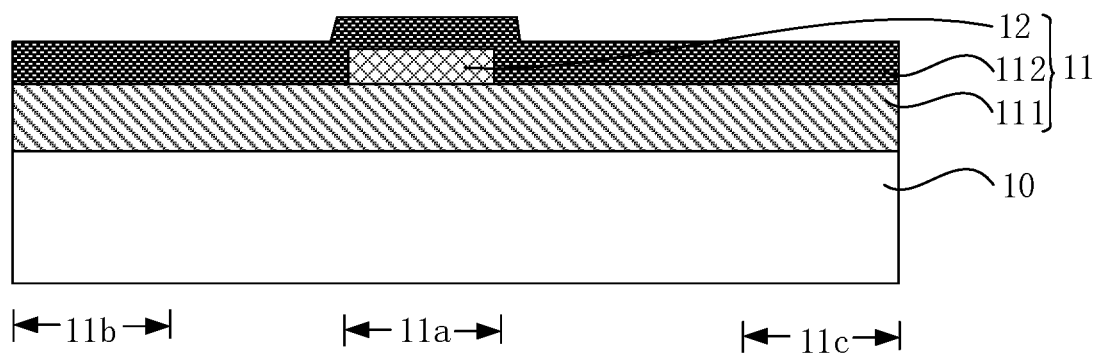

The first embodiment of the present disclosure also provides a manufacturing method of the enhancement-type semiconductor structure in FIG. 1. FIG. 2 is a flowchart of the manufacturing method; FIG. 3 and FIG. 4 are schematic views illustrating intermediate structures corresponding to the process of FIG. 2.

First, with reference to step S1 in FIG. 2 and FIG. 3, a semiconductor substrate 10 is provided, on which a channel layer 111 is formed.

The material of the semiconductor substrate 10 can include sapphire, silicon carbide, silicon or diamond.

The material of the channel layer 111 may include a gallium nitride-based material, such as GaN.

The channel layer 111 can be epitaxially grown on the semiconductor substrate 10 by Metal Organic Chemical Vapor Deposition (MOCVD) technology. Before epitaxial growth of the channel layer 111, a nucleation layer and a buffer layer can be epitaxially grown successively on the semiconductor substrate 10. The material of nucleation layer can include, for example, AlN, AlGaN, etc. The material of buffer layer can include at least one of AlN, GaN, AlGaN, or AlInGaN. The nucleation layer can alleviate the lattice mismatch and thermal mismatch between the epitaxially grown semiconductor layers (such as the channel layer 111) and the semiconductor substrate 10. The buffer layer can reduce the dislocation density and defect density of the epitaxially grown semiconductor layer, and the crystal quality can be improved.

Next, with reference to step S2 in FIG. 2 and FIG. 3, an intermediate layer 12 is formed on part of the channel layer 111; referring to FIG. 4, a first potential barrier layer 112 is formed on the intermediate layer 12 and the channel layer 111 uncovered by the intermediate layer 12; the channel layer 111, the intermediate layer 12 and the first potential barrier layer 112 form a heterojunction structure 11, the heterojunction structure 11 includes a gate region 11a, a source region 11b and a drain region 11c located on two sides of the gate region 11a respectively, the intermediate layer 12 is sandwiched between the channel layer 111 and the first potential barrier layer 112 in the gate region 11a, and the intermediate layer 12 is adapted to depolarize the contacted first potential barrier layer 112.

The intermediate layer 12 can be an amorphous layer, and the material of the amorphous layer can include at least one of silicon nitride, silicon dioxide, silicon oxynitride, hafnium oxide, aluminum oxide, or aluminum oxynitride, which is formed by physical vapor deposition, chemical vapor deposition, or atomic layer deposition. The intermediate layer 12 can be a polycrystalline layer, and the polycrystalline layer material can include at least one of polycrystalline diamond, polycrystalline nickel oxide, or polycrystalline gallium nitride, which are formed by epitaxial growth. The intermediate layer 12 can be first formed on the whole surface of the channel layer 111, and then patterned by dry etching or wet etching, only retaining a part of the intermediate layer 12 of the gate region 11a.

The thickness of the intermediate layer 12 may be greater than 0.2 nm. In an example, the thickness of the intermediate layer 12 may be greater than 1 nm. In another example, the thickness of the intermediate layer 12 may be greater than 5 nm.

The materials of the first potential barrier layer 112 can include III-V Group compound materials, and the band gap of the first potential barrier layer 112 is greater than that of channel layer 111. When the material of the channel layer 111 includes a gallium nitride-based material, such as GaN, the material of the first potential barrier layer 112 may include aluminum nitride or a gallium nitride-based material containing aluminum, or the first potential barrier layer 112 is a multilayer structure formed by one or more gallium nitride-based material layers containing aluminum and one or more aluminum nitride layers. The gallium nitride-based material containing aluminum includes, for example, AlGaN or AlInGaN.

The forming process of the first potential barrier layer 112 may refer to the forming process of the channel layer 111.

The thickness ratio of the first potential barrier layer 112 to the intermediate layer 12 may be less than 50:1.

Then, referring to step S3 in FIG. 2 and FIG. 1, a gate structure 14a is formed in the gate region 11a, and a source electrode 14b and a drain electrode 14c are formed on two sides of the gate structure 14a respectively.

In this embodiment, the gate structure 14a only includes the gate electrode 14e, and both of the source electrode 14b and drain electrode 14c contact the first potential barrier layer 112. The materials of gate electrode 14e, source electrode 14b and drain electrode 14c can include metals, such as Ti/Al/Ni/Au, Ni/Au, etc., which can be formed in whole surface by sputtering first and then patterned by etching.

Schottky contact can be formed between the gate electrode 14e and the heterojunction structure 11, and ohmic contact can be formed between the source electrode 14b and source region 11b, and between drain electrode 14c and drain region 11c.

In this embodiment, when the turn-on voltage is not applied to the gate electrode 14e, the first potential barrier layer 112 on the intermediate layer 12, whether the intermediate layer 12 is in an amorphous or polycrystalline state, can be depolarized, that is, polarization effect cannot be generated, and two-dimensional electron gas cannot be generated in the gate region 11a, thus the enhancement-type semiconductor structure 1 can be normally off.

When the turn-on voltage is applied to the gate electrode 14e, the first potential barrier layer 112 of the gate region 11a can produce a polarization effect, so that the gate region 11a can produce two-dimensional electron gas, thus enabling the enhancement-type semiconductor structure 1 is conductive.

In this embodiment, the side wall of the gate electrode 14e can be aligned with the side wall of the intermediate layer 12, or slightly wider than the side wall of the intermediate layer 12.

Figure 5:
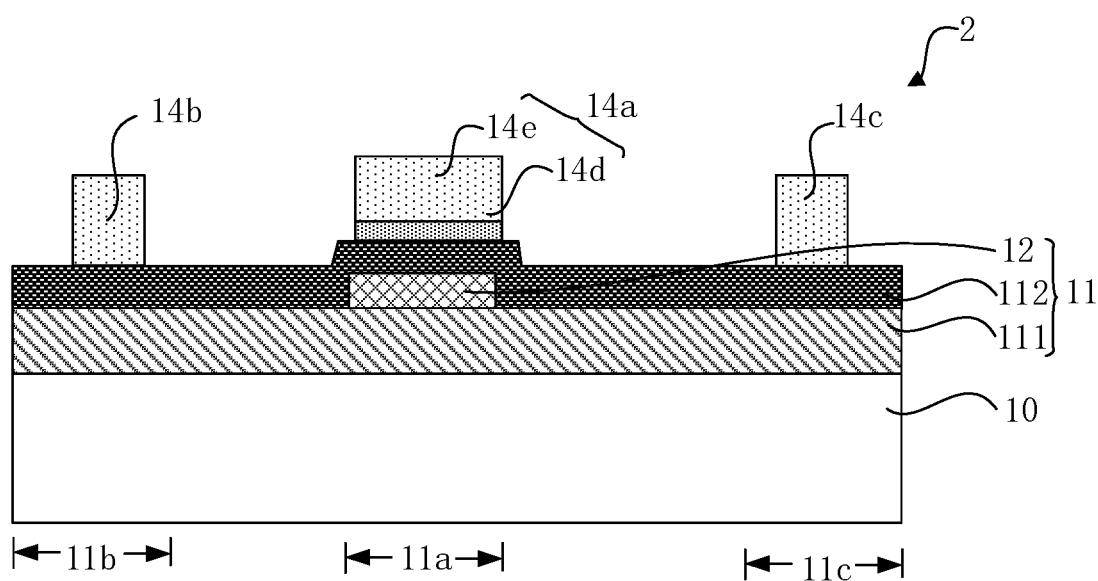
FIG. 5 is a schematic diagram of the sectional structure of the enhancement-type semiconductor structure according to a second embodiment of the present disclosure.

FIG. 5 is a schematic diagram of the sectional structure of the enhancement-type semiconductor structure according to the second embodiment of the present disclosure. With reference to FIG. 5, the difference between the enhancement-type semiconductor structure 2 of the second embodiment and the enhancement-type semiconductor structure 1 of the first embodiment is that: the gate structure 14a is a stacked structure formed by the gate insulation layer 14d and the gate electrode 14e. In other words, the enhancement-type semiconductor structure 2 is a metal-insulator-semiconductor high electron mobility transistor (MIS HEMT).

In this embodiment, both side walls of the gate insulation layer 14d are aligned with both side walls of the gate electrode 14e. In other embodiments, the gate insulation layer 14d can also be extended between the source electrode 14b and the drain electrode 14c.

In addition to the above differences, other structures of the enhancement-type semiconductor structure 2 of the second embodiment can refer to the corresponding structures of the enhancement-type semiconductor structure 1 of the first embodiment.

Correspondingly, the difference between the manufacturing method of the enhancement-type semiconductor structure 2 according to the second embodiment and the manufacturing method of the enhancement-type semiconductor structure 1 according to the first embodiment is that: in step S3, the gate structure 14a is formed on the gate region 11a as a stacked structure of the gate insulation layer 14d and the gate electrode 14e.

Specifically, step S3 may include: a gate insulation material layer is formed on the whole surface of the first potential barrier layer 112, and then the gate insulation material layer is patterned, retaining only the gate insulation material layer in the gate region 11a to form the gate insulation layer 14d; next, the metal layer is formed on the whole surface by sputtering, and then the metal layer is patterned to form the gate electrode 14e, source electrode 14b and source electrode 14c by etching.

In addition to the above differences, other steps of manufacturing method of the enhancement-type semiconductor structure 2 of the second embodiment can refer to the corresponding steps of manufacturing method of the enhancement-type semiconductor structure 1 of the first embodiment.

Figure 6:
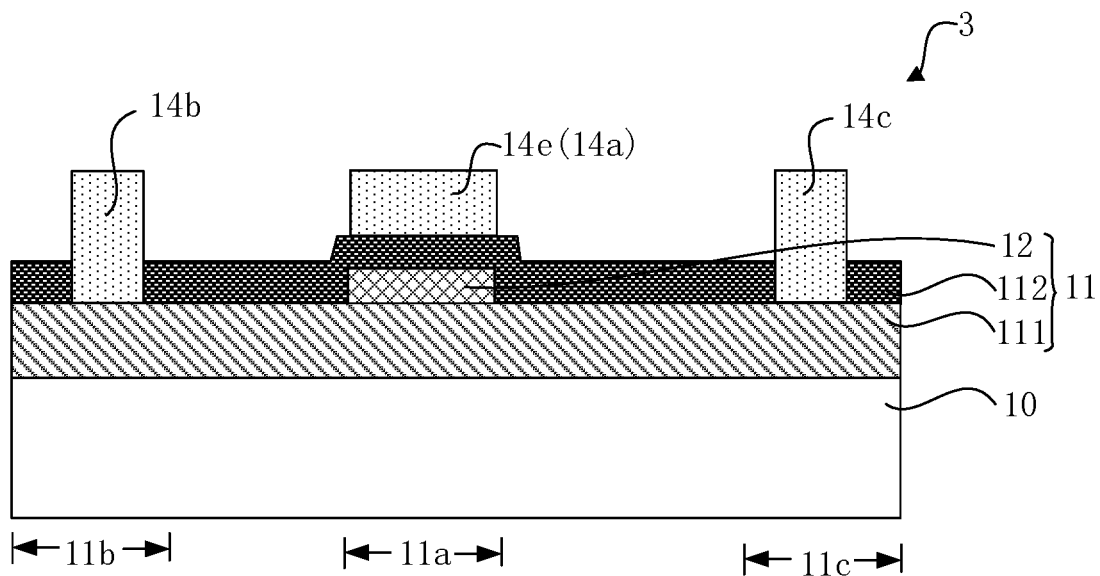
FIG. 6 is a schematic diagram of the sectional structure of the enhancement-type semiconductor structure according to a third embodiment of the present disclosure.

FIG. 6 is a schematic diagram of the sectional structure of the enhancement-type semiconductor structure according to the third embodiment of the present disclosure. As shown in FIG. 6, the enhancement-type semiconductor structure 3 and the manufacturing method thereof in the third embodiment are different from those in the first and the second embodiments in that: both of the source electrode 14b and the drain electrode 14c contact channel layer 111.

Figure 7:
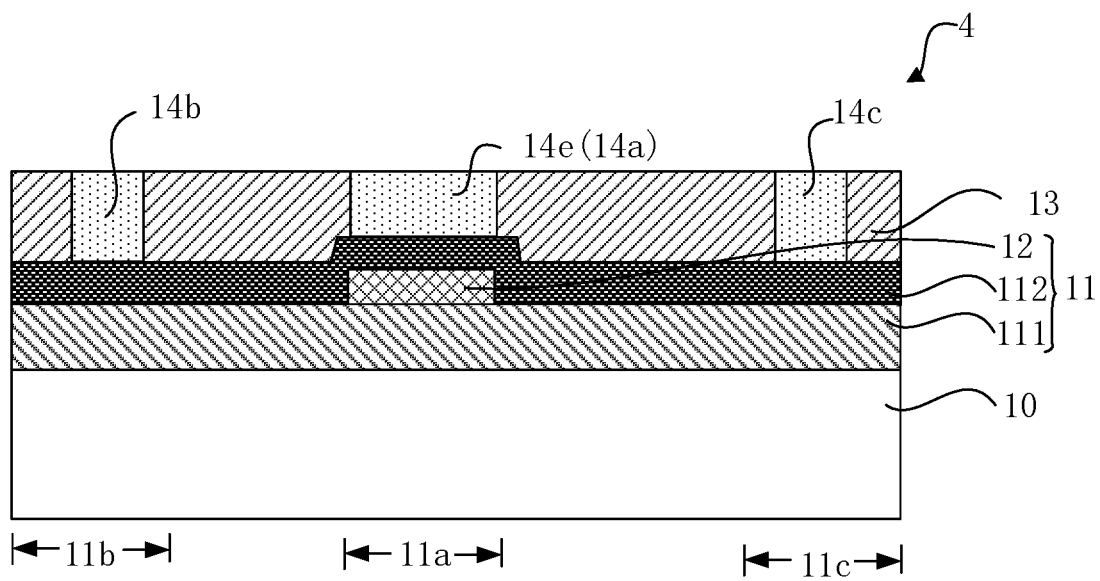
FIG. 7 is a schematic diagram of the sectional structure of the enhancement-type semiconductor structure according to a fourth embodiment of the present disclosure.

FIG. 7 is a schematic diagram of the sectional structure of the enhancement-type semiconductor structure according to the fourth embodiment of the present disclosure. Referring to FIG. 7, the difference between the enhancement-type semiconductor structure 4 of the fourth embodiment and the enhancement-type semiconductor structures 1 to 3 of the first embodiment to the third embodiment is only that: the enhancement-type semiconductor structure 4 further includes a passivation layer 13, which is arranged between the gate structure 14a and the source electrode 14b, and between the gate structure 14a and the drain electrode 14c.

In other words, the gate structure 14a is located in the passivation layer 13 of the gate region 11a, and the source 14b and drain 14c are located in the passivation layer 13 on two sides of the gate structure 14a respectively.

The material of the passivation layer 13 may include silicon nitride or silicon dioxide.

In addition to the above differences, other structures of the enhancement-type semiconductor structure 4 of the fourth embodiment can refer to the corresponding structures of the enhancement-type semiconductor structures 1 to 3 of the first embodiment to the third embodiment.

Accordingly, the manufacturing method of the enhancement-type semiconductor structure 4 according to the fourth embodiment differs from that of the enhancement-type semiconductor structures 1 to 3 in the first embodiment to the third embodiment only in that: in step S3, a passivation layer 13 is formed on the gate structure 14a, the source electrode 14b, the drain electrode 14c, and the heterostructure 11 uncovered by the gate structure 14a, the source electrode 14b, and the drain electrode 14c; the passivation layer 13 is flattened or openings are formed in the passivation layer 13, to expose the gate structure 14a, the source electrode 14b and the drain electrode 14c.

In other words, the upper surfaces of the gate structure 14a, source electrode 14b and drain electrode 14c can be flush with the upper surface of the passivation layer 13; in other embodiments, the upper surfaces of the gate structure 14a, the source electrode 14b and the drain electrode 14c can also be lower than the upper surface of the passivation layer 13.

In other embodiments, a passivation layer 13 can be formed on the heterostructure 11 first, and then a gate structure 14a can be formed in the passivation layer 13 in the gate region 11a; and a source electrode 14b and a drain electrode 14c are formed respectively in the passivation layers 13 on two sides of the gate structure 14a.

In other words, the upper surfaces of the gate structure 14a, source electrode 14b and drain electrode 14c can be flush with the upper surface of the passivation layer 13; in other embodiments, the upper surfaces of the gate structure 14a, the source electrode 14b and the drain electrode 14c can also be higher than the upper surface of the passivation layer 13.

The material of the passivation layer 13 can include silicon nitride or silicon dioxide, which is formed by physical vapor deposition or chemical vapor deposition.

In addition to the above differences, other steps of manufacturing method of the enhancement-type semiconductor structure 4 of the fourth embodiment can refer to the corresponding steps of manufacturing method of the enhancement-type semiconductor structure 1 to 3 of the first embodiment to the third embodiment.

Figure 8:
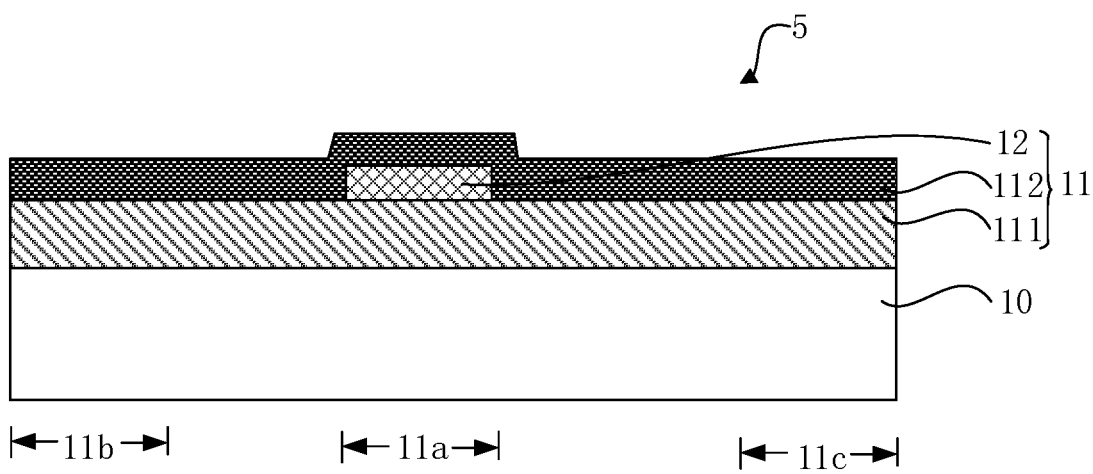
FIG. 8 is a schematic diagram of the sectional structure of the enhancement-type semiconductor structure according to a fifth embodiment of the present disclosure.

FIG. 8 is a schematic diagram of the sectional structure of the enhancement-type semiconductor structure according to the fifth embodiment of the present disclosure. As shown in FIG. 8, the enhancement-type semiconductor structure 5 and the manufacturing method thereof in the fifth embodiment are different from the enhancement-type semiconductor structures 1 to 3 in the first embodiment to the third embodiment in that: gate structure 14a, source electrode 14b, drain electrode 14c and manufacturing steps thereof are omitted.

The enhancement-type semiconductor structure 5 can be produced and sold as a semi-finished product.

Figure 9:
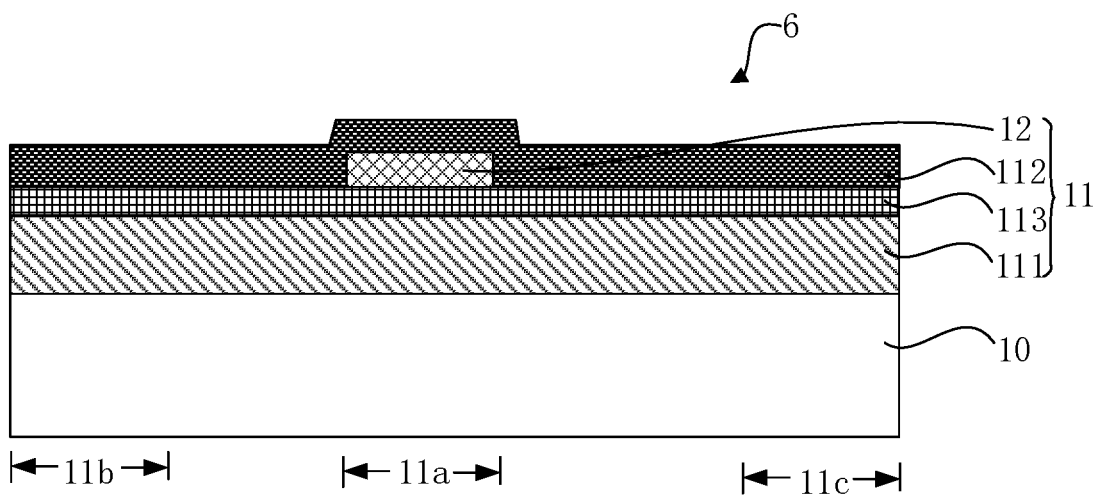
FIG. 9 is a schematic diagram of the sectional structure of the enhancement-type semiconductor structure according to a sixth embodiment of the present disclosure.

FIG. 9 is a schematic diagram of the sectional structure of the enhancement-type semiconductor structure according to the sixth embodiment of the present disclosure. Referring to FIG. 9, the difference between the enhancement-type semiconductor structure 6 of the sixth embodiment and the enhancement-type semiconductor structures 1 to 5 of the first embodiment to the fifth embodiment is only that: the heterostructure 11 further includes a second potential barrier layer 113 sandwiched between the channel layer 111 and the first potential barrier layer 112, the channel layer 111 is made of gallium nitride-based material, the second potential barrier layer 113 is made of gallium nitride-based material containing aluminum or the second barrier 113 is multilayer structure formed by one or more gallium nitride-based material layers containing aluminum and one or more aluminum nitride layers, the thickness of the second potential barrier layer 113 is less than 10 nm and/or the Al content of the gallium nitride-based material containing aluminum in the second potential barrier layer 113 is less than 10%.

In the embodiment, the intermediate layer 12 is sandwiched between the first potential barrier layer 112 in the gate region 11a and the second potential barrier layer 113 in the gate region 11a.

When the enhancement-type semiconductor structure 6 is on, the second potential barrier layer 113 can improve the interface property between the first potential barrier layer 112 and the channel layer 111, and the mobility of two-dimensional electron gas can be improved when conducting.

When the channel layer 111 is made of gallium nitride-based material, the second potential barrier layer 113 is made of gallium nitride-based material containing aluminum, such as AlGaN. The advantages of the thickness of the second potential barrier layer 113 being less than 10 nm and/or the content of Al in the second potential barrier layer 113 being less than 10% include: ensuring that when the enhancement-type semiconductor structure 6 is off, there is no two-dimensional electron gas or the concentration of two-dimensional electron gas is very low between the first potential barrier layer 112 and the channel layer 111 in the gate region 11a, which does not affect the enhancement-type semiconductor structure 6 to be in normally off.

In an example, the thickness of the second potential barrier layer 113 made of the aluminum-containing GaN based material or the thickness of the second barrier layer 113 which is the multilayer structure formed by the aluminum-containing GaN based material layer and the aluminum nitride layer can be less than 5 nm. In another example, the thickness of the second potential barrier layer 113 made of the aluminum-containing GaN based material or the thickness of the second barrier layer 113 which is the multilayer structure formed by the aluminum-containing GaN based material layer and the aluminum nitride layer can be less than 2 nm.

Without affecting the enhancement-type semiconductor structure 6 to be in normally off, in other embodiments, when the channel layer 111 is made of gallium nitride-based material, the second potential barrier layer 113 can be made of aluminum nitride. The thickness of the second potential barrier layer 113 made of aluminum nitride may be less than 10 nm. In an example, the thickness of the second potential barrier layer 113 made of aluminum nitride may be less than 5 nm. In another example, the thickness of the second potential barrier layer 113 made of aluminum nitride may be less than 2 nm.

In addition to the above differences, other structures of the enhancement-type semiconductor structure 6 of the sixth embodiment can refer to the corresponding structures of the enhancement-type semiconductor structures 1 to 5 of the embodiments 1 to 5.

Accordingly, the manufacturing method of the enhancement-type semiconductor structure 6 according to the sixth embodiment differs from that of the enhancement-type semiconductor structures 1 to 5 in embodiments 1 to 5 only in that: in step S2, before forming the intermediate layer 12, the manufacturing method of the enhancement-type semiconductor structure 6 further includes: a second potential barrier layer 113 is formed on the channel layer 111, the channel layer 111 is made of gallium nitride-based material, the second potential barrier layer 113 is made of gallium nitride-based material containing aluminum or the second potential barrier layer 113 is multilayer structure formed by a gallium nitride-based material layer containing aluminum and an aluminum nitride layer, the thickness of the second potential barrier layer 113 is less than 10 nm and/or the Al content of the gallium nitride-based material containing aluminum in the second potential barrier layer 113 is less than 10%.

The forming process of the second potential barrier layer 113 may refer to the forming process of the channel layer 111.

In an example, the thickness of the second potential barrier layer 113 made of the gallium nitride-based material containing aluminum or the thickness of the second barrier layer 113 which is the multilayer structure formed by the gallium nitride-based material layer containing aluminum and the aluminum nitride layer can be less than 5 nm. In another example, the thickness of the second potential barrier layer 113 made of the gallium nitride-based material containing aluminum or the thickness of the second barrier layer 113 which is the multilayer structure formed by the gallium nitride-based material layer containing aluminum and the aluminum nitride layer can be less than 2 nm.

In other embodiments, when the channel layer 111 is made of gallium nitride-based material, the second potential barrier layer 113 can be made of aluminum nitride. The thickness of the second potential barrier layer 113 made of aluminum nitride may be less than 10 nm. In an example, the thickness of the second potential barrier layer 113 made of aluminum nitride may be less than 5 nm. In another example, the thickness of the second potential barrier layer 113 made of aluminum nitride may be less than 2 nm.

In this embodiment, the intermediate layer 12 is formed on a part of the second potential barrier layer 113, and the first potential barrier layer 112 is formed on the intermediate layer 12 and the second potential barrier layer 113 uncovered by the intermediate layer 12; the channel layer 111, the second potential barrier layer 113, the intermediate layer 12 and the first potential barrier layer 112 form a heterojunction structure 11. The intermediate layer 12 is sandwiched between the first potential barrier layer 112 in the gate region 11a and the second potential barrier layer 113 in the gate region 11a.

In addition to the above differences, other steps of manufacturing method of the enhancement-type semiconductor structure 6 of the sixth embodiment can refer to the corresponding steps of manufacturing method of the enhancement-type semiconductor structures 1 to 5 of the embodiments 1 to 5.

Although the present disclosure discloses the above contents, the present disclosure is not limited thereto. One of ordinary skill in the art can make various variants and modifications to the present disclosure without departing from the spirit and scope of the present disclosure. Therefore, the protection scope of the present disclosure should be set forth by the appended claims.

The invention claimed is:

1. An enhancement-type semiconductor structure, comprising:
   a semiconductor substrate; and
   a heterojunction structure on the semiconductor substrate, wherein the heterojunction structure comprises a channel layer close to the semiconductor substrate and a first potential barrier layer far away from the semiconductor substrate; the heterojunction structure comprises a gate region, and a source region and a drain region located on two sides of the gate region respectively; the heterojunction structure further comprises an intermediate layer sandwiched between the channel layer in the gate region and the first potential barrier layer in the gate region; and the intermediate layer is to depolarize the first potential barrier layer in the gate region;
   wherein the intermediate layer is an amorphous layer or a polycrystalline layer;
   when the intermediate layer is the amorphous layer, a material of the amorphous layer comprises at least one of silicon nitride, silicon dioxide, silicon oxynitride, and hafnium oxide, aluminum oxide, or aluminum oxynitride; and
   when the intermediate layer is the polycrystalline layer, the material of the polycrystalline layer comprises at least one of polycrystalline diamond, polycrystalline nickel oxide, or polycrystalline gallium nitride.

2. The enhancement-type semiconductor structure according to claim 1, wherein a material of the channel layer comprises a gallium nitride-based material, and one of:

a material of the first potential barrier layer comprises aluminum nitride or a gallium nitride-based material containing aluminum; and the first potential barrier layer is a multi-layer structure formed by one or more gallium nitride-based material layers containing aluminum and one or more aluminum nitride layers.

3. The enhancement-type semiconductor structure according to claim 1, wherein a thickness of the intermediate layer is more than 0.2 nm.

4. The enhancement-type semiconductor structure according to claim 1, wherein a thickness ratio of the first potential barrier layer to the intermediate layer is less than 50:1.

5. The enhancement-type semiconductor structure according to claim 1, wherein the heterojunction structure further comprises: a second potential barrier layer sandwiched between the channel layer and the first potential barrier layer, wherein a material of the channel layer comprises a gallium nitride-based material, a material of the second potential barrier layer comprises a gallium nitride-based material containing aluminum or the second potential barrier layer is a multi-layer structure formed by one or more gallium nitride-based material layers containing aluminum and one or more aluminum nitride layers; the intermediate layer is sandwiched between the first potential barrier layer in the gate region and the second potential barrier layer in the gate region; and at least one of a thickness of the second potential barrier layer is less than 10 nm or a Al content of the gallium nitride-based material containing aluminum of the second potential barrier layer is less than 10%.

6. The enhancement-type semiconductor structure according to claim 1, wherein the heterojunction structure further comprises: a second potential barrier layer sandwiched between the channel layer and the first potential barrier layer, wherein a material of the channel layer comprises a gallium nitride-based material, a material of the second potential barrier layer comprises aluminum nitride, a thickness of the second potential barrier layer is less than 10 nm; the intermediate layer is sandwiched between the first potential barrier layer in the gate region and the second potential barrier layer in the gate region.

7. The enhancement-type semiconductor structure according to claim 1, further comprising: a gate structure located in the gate region, and a source electrode and a drain electrode located on two sides of the gate structure respectively.

8. The enhancement-type semiconductor structure according to claim 7, further comprising: a passivation layer which is disposed between the gate structure and the source electrode and between the gate structure and the drain electrode.

9. The enhancement-type semiconductor structure according to claim 7, wherein the gate structure is a stacked structure of a gate insulating layer and a gate electrode, or only comprises the gate electrode.

10. A method of manufacturing enhancement-type semiconductor structure, comprising:
providing a semiconductor substrate on which a channel layer is formed;
forming an intermediate layer on a part of the channel layer;
forming a first potential barrier layer on the intermediate layer and on the channel layer uncovered by the intermediate layer;
wherein the channel layer, the intermediate layer and the first potential barrier layer form a heterojunction structure, and the heterojunction structure comprises a gate region, and a source region and a drain region on two sides of the gate region respectively, the intermediate layer is sandwiched between the channel layer in the gate region and the first potential barrier layer in the gate region, and the intermediate layer is to depolarize the first potential barrier layer in the gate region;
wherein the intermediate layer is an amorphous layer or a polycrystalline layer;
when the intermediate layer is the amorphous layer, a material of the amorphous layer comprises at least one of silicon nitride, silicon dioxide, silicon oxynitride, and hafnium oxide, aluminum oxide, or aluminum oxynitride; and
when the intermediate layer is the polycrystalline layer, the material of the polycrystalline layer comprises at least one of polycrystalline diamond, polycrystalline nickel oxide, or polycrystalline gallium nitride.

11. The method of manufacturing enhancement-type semiconductor structure according to claim 10, wherein the amorphous layer is formed by physical vapor deposition, chemical vapor deposition, or atomic layer deposition.

12. The method of manufacturing enhancement-type semiconductor structure according to claim 10, wherein a thickness of the intermediate layer is more than 0.2 nm.

13. The method of manufacturing enhancement-type semiconductor structure according to claim 10, wherein a thickness ratio of the first potential barrier layer to the intermediate layer is less than 50:1.

14. The method of manufacturing enhancement-type semiconductor structure according to claim 10, wherein the method further comprises:
before forming the intermediate layer, forming a second potential barrier layer on the channel layer, wherein a material of the channel layer comprises a gallium nitride-based material, a material of the second potential barrier layer comprises a gallium nitride-based material containing aluminum or the second potential barrier layer is a multi-layer structure formed by one or more gallium nitride-based material layers containing aluminum and one or more aluminum nitride layers, and at least one of a thickness of the second potential barrier layer is less than 10 nm or a Al content of the gallium nitride-based material containing aluminum in the second potential barrier layer is less than 10%;
forming the intermediate layer on a part of the second potential barrier layer;
forming the first potential barrier layer on the intermediate layer and on the second potential barrier layer uncovered by the intermediate layer; wherein the channel layer, the second potential barrier layer, the intermediate layer and the first potential barrier layer form the heterojunction structure, the intermediate layer is sandwiched between the first potential barrier layer in the gate region and the second potential barrier layer in the gate region.

15. The method of manufacturing enhancement-type semiconductor structure according to claim 10, wherein the method further comprises:
before forming the intermediate layer, forming a second potential barrier layer on the channel layer, wherein a material of the channel layer comprises a gallium nitride-based material, a material of the second potential barrier layer comprises aluminum nitride, and a thickness of the second potential barrier layer is less than 10 nm;
forming the intermediate layer on a part of the second potential barrier layer; and forming the first potential barrier layer on the intermediate layer and on the second potential barrier layer uncovered by the intermediate layer; wherein the channel layer, the second potential barrier layer, the intermediate layer and the first potential barrier layer form the heterojunction structure, the intermediate layer is sandwiched between the first potential barrier layer in the gate region and the second potential barrier layer in the gate region.

16. The method of manufacturing enhancement-type semiconductor structure according to claim 10, further comprising:
    forming a gate structure in the gate region, and
    forming a source electrode and a drain electrode on two sides of gate structure respectively.

17. The method of manufacturing enhancement-type semiconductor structure according to claim 16, wherein the gate structure is a stacked structure of a gate insulating layer and a gate electrode, or only comprises the gate electrode.

* * * * *